United States Patent
Chu et al.

(10) Patent No.: US 11,257,558 B1
(45) Date of Patent: Feb. 22, 2022

(54) OVERVOLTAGE PROTECTION FOR CIRCUITS OF MEMORY DEVICES

(71) Applicant: Micron Technology, Inc., Boise, ID (US)

(72) Inventors: Wei Lu Chu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/988,285

(22) Filed: Aug. 7, 2020

(51) Int. Cl.
| | |
|---|---|
| *G11C 29/02* | (2006.01) |
| *G11C 29/12* | (2006.01) |
| *G11C 7/14* | (2006.01) |
| *G11C 29/44* | (2006.01) |
| *G11C 7/12* | (2006.01) |
| *G11C 29/50* | (2006.01) |

(52) U.S. Cl.
CPC .............. *G11C 29/021* (2013.01); *G11C 7/12* (2013.01); *G11C 7/14* (2013.01); *G11C 29/12005* (2013.01); *G11C 29/44* (2013.01); *G11C 29/50004* (2013.01)

(58) Field of Classification Search
CPC ........... G11C 29/021; G11C 7/12; G11C 7/14; G11C 29/12005; G11C 29/44; G11C 29/50004
See application file for complete search history.

(56) References Cited

U.S. PATENT DOCUMENTS

| 8,975,776 | B2 * | 3/2015 | Gunther | G05F 1/56 307/31 |
| 10,523,110 | B2 * | 12/2019 | Tao | H02M 3/33592 |

\* cited by examiner

*Primary Examiner* — Vanthu T Nguyen
(74) *Attorney, Agent, or Firm* — Holland & Hart LLP

(57) ABSTRACT

Methods, systems, and devices for protecting components in memory from overvoltage are described. A memory system may include a voltage regulator coupled with a first voltage source and a reference circuit that is configured to output a reference signal for the voltage regulator. The reference circuit may include a transistor that is used to generate the reference signal. The memory system may also include a protection circuit that is configured to maintain a voltage between a gate of the transistor and a second node of the transistor below an upper voltage limit. The protection circuit may include a comparator that is configured to compare a difference between a voltage of the reference signal output by the reference circuit and a voltage of the first voltage source with a reference voltage. The comparator may control a pull-down circuit coupled with the output of the reference circuit based on the comparison.

17 Claims, 7 Drawing Sheets

OVERVOLTAGE PROTECTION FOR CIRCUITS OF MEMORY DEVICES

BACKGROUND

The following relates generally to one or more systems for memory and more specifically to overvoltage protection for circuits of memory devices.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
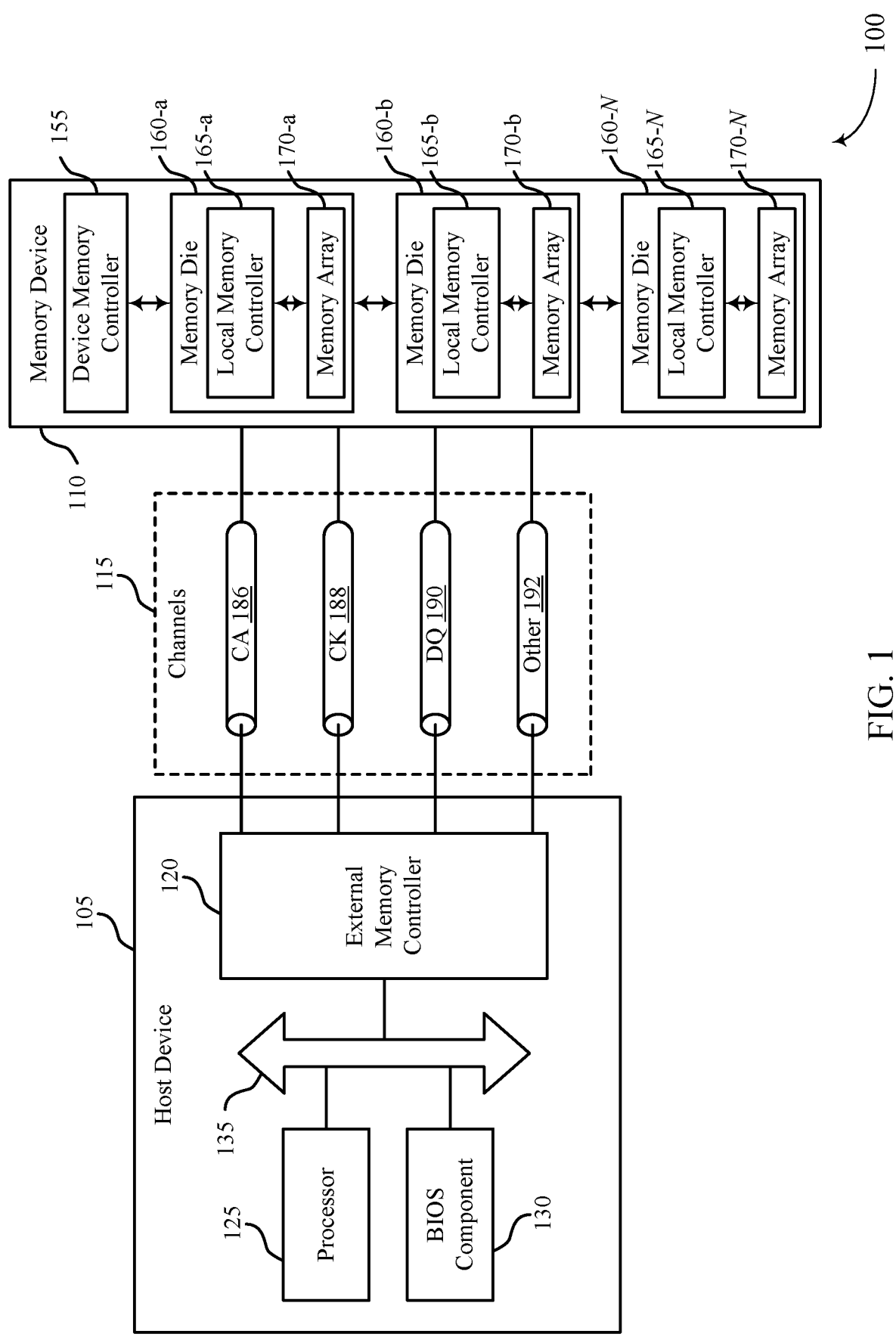
FIG. 1 shows an example of a system that supports overvoltage protection for circuits of memory devices in accordance with examples as disclosed herein.

A memory system may include power supply circuitry that is used to supply electrical energy to components in a memory device at voltages used to operate the components. The power supply circuitry may include a voltage regulator and a control circuit that sets a voltage of the voltage regulator. The control circuit may include a transistor that is coupled with a first voltage source and an operational amplifier that is coupled with a second voltage source, a gate of the transistor, and a source of the transistor. Parameters for operating a device reliably and/or for extending the life of the device ("safe operating parameters") may be determined for the transistor—e.g., an upper limit voltage difference (e.g., a maximum voltage difference) to be applied between a gate and source of the transistor may be determined. In some examples, the voltage difference between the gate and source of the transistor may be referred to as a gate-to-source voltage, and the determined upper limit voltage difference may be referred to as an upper limit gate-to-source voltage.

A difference between a voltage level of the second voltage source and a voltage level of the first voltage may be applied between a gate and source of the transistor. In some examples, during a startup period of a memory device, the second voltage source coupled with the operational amplifier may reach a final voltage level faster than the first voltage source coupled with the transistor. In such cases, larger voltages may be applied between the gate and source of the transistor for a longer duration during the startup period. Similarly, during operation of the memory device, transients in a voltage output by the sense amplifier and/or in the first voltage source may cause large voltages to be temporarily applied between the gate and source of the transistor.

In some examples, such as during startup, the gate-to-source voltage of the transistor may exceed a "safe" or preferred level (e.g., may exceed an upper limit of a gate-to-source voltage for the transistor) until the first voltage source coupled with the transistor reaches a certain voltage level—e.g., a voltage level where the voltage difference between the second voltage source and the first voltage source is less than or equal to the upper limit gate-to-source voltage. Similarly, during operation, the gate-to-source voltage of the transistor may exceed a safe level if a voltage of the gate temporarily increases or a voltage of the source rapidly temporarily decreases—e.g., if the voltage of the gate spikes upward or the voltage of the source of the transistor spikes downward. The transistor may be damaged or fail based on the repeated application of an excessive voltage between the gate and source of the transistor, even if that application is temporary. The risk of damage to the transistor may increase if the transistor is manufactured using high-performance compact process.

To maintain the reliability of the transistor, a protection circuit may be incorporated into the power supply circuitry that prevents an excessive voltage from being applied between a gate and source of the transistor. In some examples, a protection circuit that prevents a voltage between the gate and source of a transistor from exceeding an upper limit is included in a power supply circuit. The protection circuit may include a pull-down device that pulls down a voltage of the gate of the transistor when a voltage between the gate and source of a transistor exceeds a second upper limit. By including the protection circuit in the power supply circuit, a reliability of the transistor may be maintained and a life of the transistor may be extended.

Features of the disclosure are initially described in the context of systems and dies, as described with reference to FIGS. 1 and 2. Features of the disclosure are also described in the context of systems described with reference to FIGS. 3 and 4. Features of the disclosure are additionally described in the context of signal plots as described with reference to FIG. 5. These and other features of the disclosure are further illustrated by and described with reference to an apparatus diagram and a flowchart that relate to overvoltage protection for circuits of memory devices, as described with reference to FIGS. 6 and 7.

FIG. 1 shows an example of a system 100 that supports overvoltage protection for circuits of memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may show aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A system 100 may include power supply circuitry that is used to supply electrical energy to components in a memory device (e.g., local memory controllers 165, components of memory array 170-b, etc.) at operating voltages for the components. The power supply circuitry may include a voltage regulator and a control circuit that sets a voltage of the voltage regulator. The control circuit may include a transistor that is coupled with a first voltage source and an operational amplifier that is coupled with a second voltage source, a gate of the transistor, and a source of the transistor. Safe operating parameters may be determined for the transistor—e.g., an upper limit of a gate-to-source voltage.

To maintain the reliability of the transistor, a protection circuit may be incorporated into the power supply circuitry that prevents an excessive voltage from being applied between a gate and source of the transistor. In some examples, a protection circuit that prevents a voltage between the gate and source of a transistor from exceeding an upper limit is included in a power supply circuit. The protection circuit may include a pull-down device that pulls down a voltage of the gate of the transistor when a voltage between the gate and source of a transistor exceeds a second upper limit. By including the protection circuit in the power supply circuit, a reliability of the transistor may be maintained and a life of the transistor may be extended.

Figure 2:
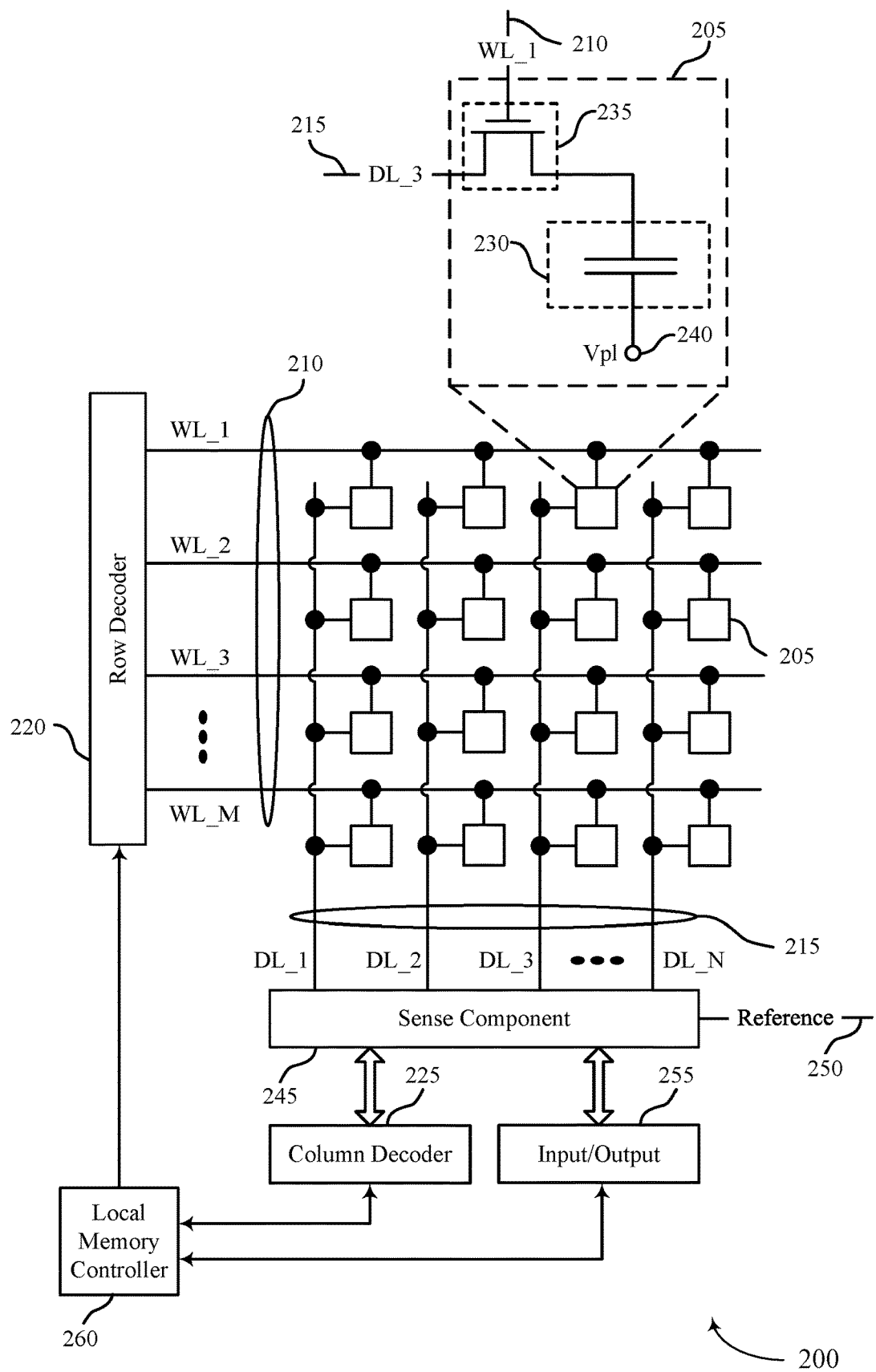
FIG. 2 shows an example of a memory die that supports overvoltage protection for circuits of memory devices in accordance with examples as disclosed herein.

FIG. 2 shows an example of a memory die 200 that supports overvoltage protection for circuits of memory devices in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as $V_{pl}$, or may be ground, such as $V_{SS}$.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

A memory die 200 may include a power system that supplies electrical energy to different components in the memory die 200 (e.g., row decoder 220, column decoder, 225, sense component 245, local memory controller 260, among other components). The power system may include voltage regulators to ensure that electrical energy is provided to corresponding components in a memory device at a proper voltage. The power system may include circuitry that can be used to control the voltage regulators. That is, the control circuitry may generate a reference signal for setting an output voltage of a voltage regulator. In some cases, a value (or level) of the reference signal may be based on an input signal provided to the control circuitry.

In some examples, a control circuit that is configured to generate a reference for a voltage regulator includes an operational amplifier (e.g., an operational transconductance amplifier), a transistor (e.g., an N-channel field-effect transistor), and a biasing component (e.g., a resistor). In some examples, safe operating parameters may be determined for the transistor. For example, an upper limit of a current passed by the transistor, an upper limit of a voltage applied to a gate of the transistor, an upper limit of a gate-to-source voltage, or any combination thereof may be determined. Exceeding these operating parameters may not always result in immediate failure of the transistor but may degrade a life and/or ongoing performance of the transistor.

A drain of the transistor may be coupled with a first voltage source, a source of the transistor may be coupled with a negative input of the operational amplifier, and a gate of the transistor may be coupled with an output of the operational amplifier. Thus, the operational amplifier and transistor may be configured in a voltage follower configuration. Also, if the control circuit is biased correctly (e.g., if the resistor is appropriately sized), a voltage of the source of the transistor may match a voltage of a signal applied to a positive input of the operational amplifier, and a voltage of the gate of the transistor may be based on adding the voltage of the source of the transistor with a threshold voltage ($V_{th}$) of the transistor.

In some examples, the operational amplifier may be coupled with a second voltage source that is different than the first voltage source coupled with the drain of the transistor. In such cases, during a startup period, the operational amplifier may operate as a comparator—e.g., when the first voltage source ramps to a final voltage level more slowly than the second voltage source. In some examples, the operational amplifier may operate as a comparator until the first voltage source coupled with the drain of the transistor reaches a particular voltage level. While operating as a comparator, the operational amplifier may output a voltage that matches a voltage of the second voltage source coupled with the operational amplifier—e.g., if a difference between the voltage at the positive input of the operational amplifier is greater than the voltage at the negative input of the operational amplifier, the operational amplifier may output a high voltage that approaches the level of the second voltage source. Once the first voltage source coupled with the drain of the transistor reaches the voltage level, the operational amplifier may begin operating as an amplifier, and may ultimately output a voltage that causes the voltage at the negative input of the operational amplifier (and the source of the transistor) to match the voltage at the positive input of the operational amplifier. The voltage output by the operational amplifier (and applied at the gate of the transistor) may be based on a summation of the voltage at the source of the transistor with a threshold voltage of the transistor.

During startup, while the operational amplifier applies a high voltage to the gate of the transistor, the voltage of the source of the transistor may match the voltage of the first voltage source that is coupled with the drain of the transistor (e.g., the transistor may be operated in a linear mode as a pass transistor). Thus, the gate-to-source voltage (which may also be referred to as $V_{gs}$) of the transistor and a voltage of a source of the transistor may be based on (e.g., equivalent or nearly equivalent to) a difference between the voltage of the second voltage source coupled with the operational amplifier and the first voltage source coupled with the drain of the transistor. When the first voltage source coupled with the drain of the transistor ramps to a final voltage level more slowly than the second voltage source coupled with the operational amplifier, larger voltages may be applied between the gate and source of the transistor for longer periods of time.

In some examples, during startup, the gate-to-source voltage of the transistor may exceed a safe level (may exceed an upper limit of a gate-to-source voltage for the transistor) until the first voltage source coupled with the transistor reaches a certain voltage level—e.g., a voltage level where the voltage difference between the second voltage source and the first voltage source is less than or equal to the upper limit gate-to-source voltage. Similarly, during other operations, the gate-to-source voltage of the transistor may exceed a safe level if a voltage of the gate temporarily increases or a voltage of the source rapidly temporarily decreases—e.g., if the voltage of the gate spikes upward or the voltage of the source of the transistor spikes downward. In some examples, the transistor may be damaged or fail based on the excessive voltage being applied between the gate and source of the transistor. Repeatedly exceeding the safe voltage or exceeding the safe voltage for an extended duration may cause the materials of the transistor to be damaged, which may result in the performance of the transistor declining or failing altogether.

To maintain the reliability of the transistor, a protection circuit may be incorporated into the power supply circuitry that reduces a likelihood that an excessive voltage is applied between a gate and source of the transistor. In some examples, a protection circuit that reduces a likelihood that a voltage between the gate and source of a transistor from exceeding an upper limit is included in a power supply circuit. The protection circuit may include a pull-down device that pulls down a voltage of the gate of the transistor when a voltage between the gate and source of a transistor exceeds a second upper limit. By including the protection circuit in the power supply circuit, a reliability of the transistor may be maintained and a life of the transistor may be extended.

Figure 3:
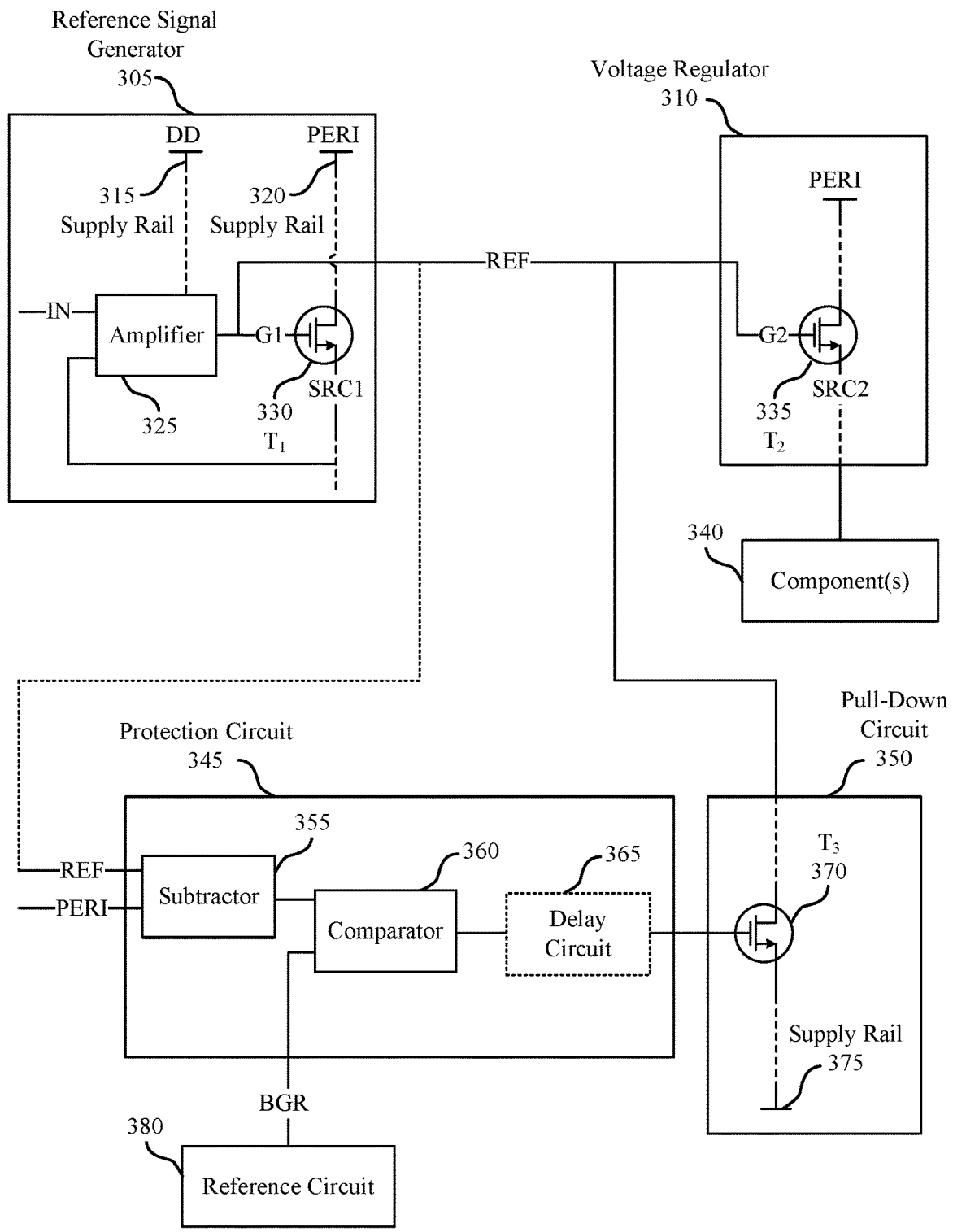
FIGS. 3 and 4 show examples of systems that supports overvoltage protection for circuits of memory devices in accordance with examples as disclosed herein.

FIG. 3 shows an example of a system 300 that supports overvoltage protection for circuits of memory devices in accordance with examples as disclosed herein. The dashed lines in FIG. 3 are used to convey that additional circuitry and/or components may be included between the components connected by the dashed lines. The dotted lines in FIG. 3 are used to convey that there is a relationship between the components connected by the dashed lines—thus, a physical coupling between the lines may not be present and/or additional circuitry may be included between the components.

System 300 (e.g., a power system) may include a reference signal generator 305, a voltage regulator 310, components 340, protection circuit 345, pull-down circuit 350, and reference circuit 380.

Reference signal generator 305 may be configured to generate a reference signal (which may be referred to as REF signal) for one or more voltage regulators (e.g., voltage regulator 310). The voltage output by the voltage regulators that receive the reference signal may be based on the voltage of the reference signal. Reference signal generator 305 may include first supply rail 315, second supply rail 320, amplifier 325, and first transistor 330 (which may be referred to as $T_1$).

First supply rail 315 may be configured to supply a voltage to a portion of reference signal generator 305. For example, first supply rail 315 may be configured to supply a voltage to amplifier 325. The signal at first supply rail 315 may be provided by a main power supply for a memory system. In some examples, the signal on first supply rail 315 may be referred to as a DD signal. A voltage of the DD signal may be represented as $V_{DD}$.

Second supply rail 320 may be configured to supply a voltage to another portion of reference signal generator 305. For example, second supply rail 320 may be configured to supply a voltage to first transistor 330. In some examples, the voltage supplied by the second supply rail 320 is different than the voltage supplied by the first supply rail 315. The signal at second supply rail 320 may be provided by a peripheral power supply that is used to power peripheral components in a memory system. In some examples, the signal on second supply rail 320 may be referred to as a PERI signal. A voltage of the PERI signal may be represented as $V_{PERI}$. In some examples, a duration for increasing a voltage of first supply rail 315 ($V_{DD}$) from an initial voltage (e.g., 0V) to a final voltage ($V_{DD,PK}$; e.g., 2.5 V or 2.75 V) may be shorter than a duration for increasing a voltage of second supply rail 320 ($V_{PERI}$) from an initial voltage (e.g., 0V) to a final voltage ($V_{PERI,PK}$; e.g., 1.2 V).

Amplifier 325 may be configured to amplify a difference between a voltage applied to a positive input of amplifier 325 and a negative input of amplifier 325. When configured as a voltage follower (e.g., when an output of amplifier 325 is coupled (directly or indirectly) with a negative input of amplifier 325), amplifier 325 may be configured to reduce (e.g., drive toward zero or minimize) a voltage difference between the positive input and the negative input of amplifier 325. Thus, the voltage output by amplifier 325 may match (closely or with an offset) a voltage of the positive input. An input signal (which may be referred to as IN input) may be applied to a positive input of amplifier 325. When configured as a voltage follower, amplifier 325 may be configured to drive a voltage of a negative input of amplifier 325 to match a voltage of the input signal (which may be represented as $V_{IN}$), and an output of amplifier 325 may be based on the voltage of the input signal (e.g., may be offset from the input signal).

First transistor 330 may be configured to set an output of amplifier 325 to a voltage level that is based on $V_{IN}$ and a threshold voltage ($V_{th1}$) of first transistor 330 once the reference signal generator 305 reaches an operational state—e.g., after the reference signal generator 305 exits a powerup state. In some examples, reference signal generator 305 reaches the operational state when a voltage of the second supply rail reaches a voltage level that enables a voltage of a source of first transistor 330 to match $V_{IN}$—e.g., when $V_{PERI}$ is greater than or equal to $V_{IN}$. For example, once, or at least after, reference signal generator 305 reaches an operational state, first transistor 330 may be operated in a saturation region, and a voltage of the gate of first transistor 330 (which may be referred to as $V_{G1}$) may be based on $V_{IN}+V_{th1}$—more specifically, $V_{G1} \approx V_{SRC1}+V_{th1}$, where $V_{SRC1} \approx V_{IN}$. In some examples, a voltage at the gate of first transistor is the same as (or roughly equivalent) to the voltage output by reference signal generator 305 ($V_{G1} \approx V_{REF}$). First transistor 330 may be an N-channel device. Alternatively, first transistor 330 may also be a P-channel device (with minor modifications to reference signal generator 305).

Before the reference signal generator 305 reaches an operational state (e.g., while the reference signal generator 305 is in a powerup state), amplifier 325 may operate as a comparator, simply amplifying a voltage difference between a positive and negative input of amplifier 325. In some examples, amplifier 325 may output a voltage that is equivalent to a voltage of first supply rail 315—e.g., when a voltage of first supply rail 315 increases at a faster rate than a voltage of second supply rail 320. Thus, the voltage of first supply rail 315 ($V_{DD}$) may be applied to a gate of first transistor 330, and first transistor 330 may be configured in a linear mode—that is, first transistor 330 may act as a pass transistor. Accordingly, a voltage of second supply rail 320 ($V_{PERI}$), or a closely related voltage, may be applied to a source of first transistor 330. And a voltage difference ($V_{GS1}$) between the gate of first transistor 330 and the source of first transistor 330 may be roughly equivalent to $V_{DD}-V_{PERI}$.

Voltage regulator 310 may be configured to regulate a supply voltage, thereby supplying a voltage having a desired (e.g., reduced) level to components within a memory system (e.g., components 340). Voltage regulator 310 may include a second transistor 335 that is coupled with a supply rail that is coupled with the $V_{PERI}$ signal (which may be referred to as a "$V_{PERI}$ supply rail").

Second transistor 335 may be used to supply a voltage to components within a memory system—e.g., to components 340. The voltage supplied from the source of second transistor 335 may be based on a voltage of the reference signal output by reference signal generator 305 ($V_{REF}$) and received at a gate of second transistor 335. For example, the voltage ($V_{SRC2}$) of the source of second transistor 335 may be based on $V_{REF}$ and a threshold voltage ($V_{th2}$) of second transistor 335, where $V_{SRC2} \approx V_{REF}-V_{th2}$. Second transistor 335 and first transistor 330 may be similarly constructed—e.g., second transistor 335 may have similar dimensions and have a similar material compositions as first transistor 330. Thus, a threshold voltage of second transistor 335 may closely match a threshold voltage of first transistor 330—$V_{th1} \approx V_{th2}$. Accordingly, a voltage of the source of second transistor 335 may closely match a voltage of the source of first transistor 330—$V_{SRC2} \approx V_{SRC1}$. Therefore, similar to first transistor 330, a voltage ($V_{GS2}$) applied between the gate and source of second transistor 335 may be roughly equivalent to $V_{DD}-V_{PERI}$ while reference signal generator 305 is in a powerup state—e.g., because a voltage of the gate of second transistor 335 ($V_{G2}$) may be roughly equivalent to a voltage output by amplifier 325 ($V_{G2} \approx V_{DD}$), and $V_{SRC2}$ may be roughly equivalent to $V_{PERI}$ ($V_{SRC2} \approx V_{PERI}$). Second transistor 335 may be an N-channel device. Alternatively, second transistor 335 may be a P-channel device (with minor modifications to voltage regulator 310).

Components 340 may be configured to support an operation of a memory device. Components 340 may include drivers that are used to drive access lines used to access a memory cell—e.g., digit lines, word lines, plate lines, etc. Components 340 may also include sense components that are used to sense a logic state of a memory cell. Sense components may also be used to drive a digit line that is coupled with a memory cell. Components 340 may also include encoders and decoders used to store and retrieve data, among other components.

The voltage of first supply rail 315 may reach a final voltage faster (i.e., may increase at a faster rate) than the voltage of second supply rail 320. Thus, excessive voltages may be applied between a gate and source of first transistor 330 and second transistor 335 for a longer duration until the voltage of second supply rail 320 reaches a particular voltage. As also discussed herein, safe operating parameters (e.g., an upper limit of gate-to-source voltages) may be determined for first transistor 330 and second transistor 335. In some examples, the safe operating parameters for first transistor 330 and second transistor 335 may be the same (or similar)—e.g., based on first transistor and second transistor 335 being similarly constructed. In some examples, the voltage applied between the gates and sources of first transistor 330 and second transistor 335 may exceed an upper limit of gate-to-source voltages (e.g., ~ 1.4V) determined for the transistor while reference signal generator 305 operates in the powerup state—that is, until the voltage of second supply rail 320 reaches a particular voltage (e.g., until $V_{DD}-V_{PERI}<1.4V$). Similarly, during operation, spikes in a voltage of the gate or source of first transistor 330 may cause excessive gate-to-source voltages to be applied to first transistor 330 and/or second transistor 335. An application of an excessive gate-to-source voltage to a transistor may be referred to as an overvoltage condition for the transistor.

Protection circuit 345 may be configured to protect first transistor 330 and/or second transistor 335 from being damaged by an overvoltage condition during powerup and/or during operation. That is, protection circuit 345 may be configured to maintain a gate-to-source voltage of first transistor 330 and/or second transistor 335 below an upper limit—e.g., by pulling down a voltage of a signal output by reference signal generator (REF signal). Protection circuit 345 may be configured to determine a voltage difference between a voltage ($V_{REF}$) output by reference signal generator 305 and a voltage ($V_{PERI}$) of a voltage source that is coupled with second supply rail 320. Protection circuit 345 may be configured to compare the determined voltage difference with a reference voltage ($V_{BGR}$) that is based on an upper limit of a gate-to-source voltage for first transistor 330. Protection circuit 345 may further be configured to activate pull-down circuit 350 when the voltage difference is greater than the reference voltage—e.g., when ($V_{REF}-V_{PERI})>V_{BGR}$. Protection circuit 345 may include subtractor 355 and comparator 360. Protection circuit 345 may also include delay circuit 365.

Subtractor 355 may be configured to determine a voltage difference between a voltage ($V_{REF}$) output by reference signal generator 305 and a voltage ($V_{PERI}$) of second supply rail 320. In some examples, a control signal trace (e.g., a trace with a small width) may be coupled with the output of reference signal generator 305 and an input of protection circuit 345 to provide the voltage output by reference signal generator 305 to protection circuit 345. In other examples, a controller may measure a voltage of the output of reference signal generator 305 and provide a signal that is indicative of the voltage to the input of protection circuit 345.

Comparator 360 may be configured compare the determined voltage difference ($V_{REF}-V_{PERI}$) with a reference voltage ($V_{BGR}$). In some examples, comparator 360 may be configured to include subtractor 355 or to perform on its own a subtraction function.

Delay circuit 365 may be configured to detect a rising and falling edge of a signal output by comparator 360. In some examples, delay circuit 365 may be further configured to delay transitioning an output of delay circuit 365 after detecting one of the edges (e.g., after detecting a rising edge) and may refrain from transitioning the output of delay circuit 365 if delay circuit 365 detects the other edge type before a delay period expires. That is, delay circuit 365 may initially output a first voltage, detect a rising edge, maintain the first voltage, detect a falling edge prior to a delay period expiring, and continue outputting the first voltage based on the delay period not expiring. Alternatively, delay circuit 365 may initially output a first voltage, detect a rising edge, and output a second voltage after delay period expires without a falling edge being detected. Delay circuit 365 may prevent protection circuit 345 from prematurely or unnecessarily disabling the pull-down circuit 350.

Pull-down circuit 350 may be configured to reduce a voltage output by reference signal generator (e.g., $V_{REF}$) based on a control signal received from protection circuit 345. Similarly, pull-down circuit 350 may be configured to reduce a voltage applied by amplifier 325 to a gate of first transistor 330. Pull-down circuit 350 may include third transistor 370.

Third transistor 370 may be configured to couple an output of reference signal generator 305 to third supply rail 375 (e.g., a ground reference or negative supply rail) in accordance with a control signal received from protection circuit 345. Third transistor 370 may couple the output of reference signal generator 305 to third supply rail 375 when a high voltage is applied to a gate of third transistor 370—e.g., when the control signal is low. Third transistor 370 may decouple (isolate) the output of reference signal generator 305 from third supply rail 375 when a low voltage is applied to the gate of third transistor 370—e.g., when the control signal is high. Third transistor 370 may be an N-channel device. Alternatively, third transistor 370 may be a P-channel device (with minor modifications to pull-down circuit 350).

Reference circuit 380 may be configured to provide a reference signal (which may be referred to as a BGR signal) to protection circuit 345 (and comparator 360). A voltage of the reference signal ($V_{BGR}$) may be selected to be less than or equal to an upper limit of a safe gate-to-source voltage determined for first transistor 330 and/or second transistor 335—e.g., less than or equal to 1.4V. In some examples, the reference voltage may be selected to be a percentage of the upper limit of the safe gate-to-source voltage (e.g., between 70 and 90%). Reference circuit 380 may be a bandgap reference circuit. A bandgap reference signal may generate a reference signal that is resistant to changes in operating conditions (e.g., temperature).

In some examples, the system 300 includes multiple voltage regulators (including voltage regulator 310), and reference signal generator 305 is configured to provide REF signal to one or more of the voltage regulators. In such cases, protection circuit 345 may be used to protect first transistor 330, second transistor 335, and/or additional transistors included in any additional voltage regulators coupled with reference signal generator 305 and protected by protection circuit 345.

Figure 4:
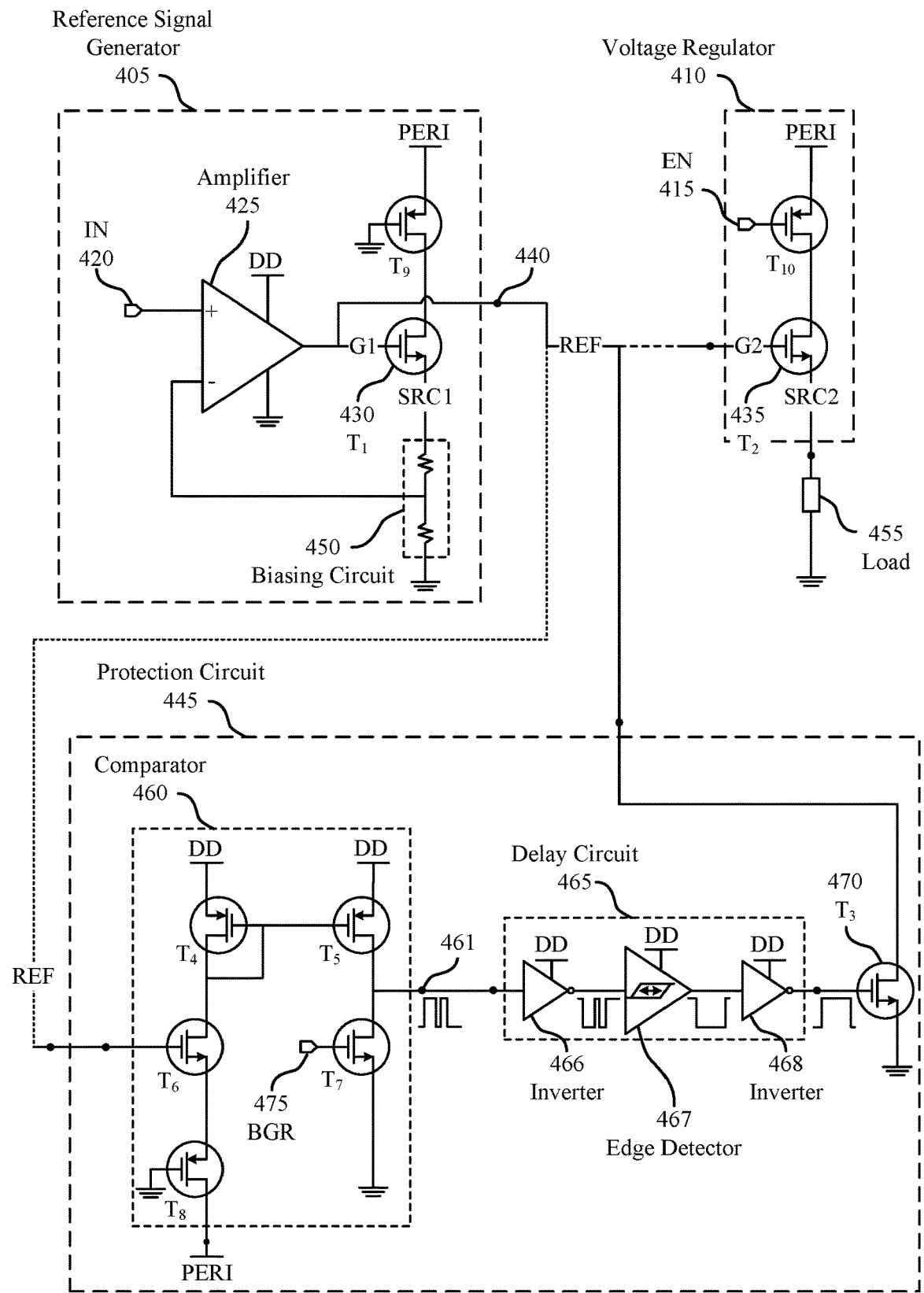

FIG. 4 shows an example of a system 400 that supports overvoltage protection for circuits of memory devices in accordance with examples as disclosed herein. The dashed lines in FIG. 4 that are in-line with other circuit components are used to convey that additional circuitry and/or components may be included between the components connected by the dashed lines. The dotted lines in FIG. 4 that are in-line with other circuit components are used to convey that there is a relationship between the components connected by the dashed lines—thus, a physical coupling between the lines may not be present and/or additional circuitry may be included between the components.

The system 400 (e.g., a power system) may include reference signal generator 405, voltage regulator 410, and protection circuit 445, which may be respective examples of reference signal generator 305, voltage regulator 310, and protection circuit 345, as described with reference to FIG. 3.

Reference signal generator 405 may include amplifier 425 and first transistor 430, which may be respective examples of amplifier 325 and first transistor 330, as described with reference to FIG. 3. Amplifier 425 may be coupled with a supply rail that is coupled with the $V_{DD}$ signal (which may be referred to as a "$V_{DD}$ supply rail"). Reference signal generator 405 may also include biasing circuit 450 and ninth transistor (T9). Biasing circuit 450 may be configured to ensure that first transistor 430 is configured in a saturation region once the reference signal generator 405 reaches an operational state. Biasing circuit 450 may further be configured to ensure that a voltage of a source of first transistor 430 is capable of matching the voltage input into a positive input of amplifier 425. In some examples, the lower resistor of biasing circuit 450 is configured to have a larger resistance than the upper resistor of biasing circuit 450. The ninth transistor T9 may be used to isolate the first transistor 430 from the $V_{PERI}$ supply rail until a voltage of the $V_{PERI}$ supply rail exceeds a threshold voltage of the ninth transistor T9. That is, ninth transistor T9 may be configured to isolate the reference signal generator 405 from transient signals on the $V_{PERI}$ supply rail.

First input 420 (which may be referred to as IN input) may be provided to reference signal generator 405. The output of reference signal generator 405 may be based on a value of first input 420. For example, a voltage ($V_{REF}$) of the output 440 of reference signal generator 405 may be roughly equivalent to summation of a voltage of first input 420 (which may be represented as $V_{IN}$) and a threshold voltage ($V_{th1}$) of first transistor 430—$V_{REF} \approx V_{IN} + V_{th1}$. Also, a voltage of the source ($V_{SRC1}$) of first transistor 430 may be roughly equivalent to $V_{IN}$. Thus, a voltage of the source ($V_{SRC2}$) of second transistor 435 may be roughly equivalent to $V_{IN}$—e.g., because a common voltage ($V_{REF}$) may be applied to the gates of both transistors and assuming voltage regulator 410 is sufficiently loaded.

Voltage regulator 410 may include second transistor 435, which may be an example of second transistor 335, as described with reference to FIG. 3. Voltage regulator 410 may also include a tenth transistor (T10). The tenth transistor T10 may serve a similar purpose as the ninth transistor T9 included in reference signal generator 405. In some examples, voltage regulator 410 is configured to match an output stage of reference signal generator 405—tenth transistor T10 and second transistor 435 of voltage regulator 410 may match ninth transistor T9 and first transistor 430 of reference signal generator 405. Voltage regulator 410 may supply a voltage to load 455, where load 455 may be represent the energy drawn by one or more components in a memory device (e.g., components 340 of FIG. 3).

Enable input 415 (which may be referred to as EN input) may be provided to voltage regulator 410. Enable input 415 may be used to enable or disable the voltage regulator 410.

For example, when enable input 415 is high, the tenth transistor T10 may isolate the second transistor 435 from the supply rail.

Protection circuit 445 may include comparator 460 and third transistor 470, which may be an example of third transistor 370, as described with reference to FIG. 3. Protection circuit 445 may also include delay circuit 465, which may be an example of delay circuit 365, as described with reference to FIG. 3. In some examples, delay circuit 465 is omitted from protection circuit 445.

Comparator 460 may be configured to compare a difference between a voltage ($V_{REF}$) of an output 440 of reference signal generator 405 and a voltage ($V_{PERI}$) of a supply rail coupled with first transistor 430 with a voltage ($V_{BGR}$) of reference input 475. In some cases, reference input 475 may be referred to as a BGR input. Comparator 460 may perform the functions of subtractor 355 and comparator 360, as described with reference to FIG. 3. Comparator 460 may include fourth transistor (T4), fifth transistor (T5), sixth transistor (T6), seventh transistor (T7), and eighth transistor (T8). Eighth transistor T8 may be used to isolate the comparator 460 from transients on the $V_{PERI}$ supply rail—e.g., from transients cause by an electrostatic discharge. In some examples, eighth transistor T8 may be omitted from comparator 460. Fourth transistor T4 and fifth transistor T5 may be configured in a current mirror configuration. Sixth transistor T6 may be configured to receive an input voltage that corresponds to a voltage ($V_{REF}$) output by reference signal generator 405. Seventh transistor T7 may be configured to receive reference input 475. A voltage ($V_{BGR}$) of reference input 475 may be based on a bandgap reference.

Sixth transistor T6 may perform a subtraction function to obtain the voltage difference between $V_{REF}$ and $V_{PERI}$—e.g., by coupling a gate of sixth transistor T6 with an output 440 of reference signal generator and a source of sixth transistor T6 with the $V_{PERI}$ supply rail. The sixth transistor T6 and seventh transistor T7 may compose an input stage of comparator 460, where the voltage difference is a first input and a voltage of reference input 475 is a second input. Fourth transistor T4 and fifth transistor T5 may compose an output stage of comparator 460 that performs a comparison function between the first input and the second input. Thus, when the voltage difference ($V_{REF}-V_{PERI}$) is smaller than a voltage of reference input 475 ($V_{BGR}$), a voltage of output 461 of comparator 460 transitions low (e.g., 0V). And when the voltage difference is greater than a voltage of reference input 475, a voltage of output 461 of comparator 460 transitions high (e.g., toward $V_{DD}$).

In some examples, the output 461 of comparator 460 may be directly coupled with a gate of third transistor 470. Thus, when the voltage difference is greater than a voltage of reference input 475 (and a voltage of output 461 is high), third transistor 470 may be activated and a voltage of output 440 may be pulled toward ground. Alternatively, when the voltage difference is less than a voltage of reference input 475 (and a voltage of output 461 is low), third transistor 470 may be deactivated and a voltage of output 440 may be pulled toward $V_{DD}$.

Delay circuit 465 may include first inverter 466, edge detector 467, and second inverter 468. First inverter 466 may be used to invert a signal output by comparator 460. Edge detector 467 may be configured to detect rising and falling edges of an input signal, outputting a first voltage when a rising edge is detected and a second voltage when a falling edge is detected. Edge detector 467 may also be configured to delay transitioning from the second voltage to the first voltage based on a rising edge being detected. If edge detector 467 detects a falling edge during the period of time, edge detector 467 may maintain the second voltage. If edge detector 467 fails to detect a falling edge during the period of time, edge detector 467 may transition to the first voltage. Second inverter 468 may be configured to invert a signal output by edge detector 467. In some examples, the first inverter 466, edge detector 467, and second inverter 468 are replaced with an edge detector that outputs the first voltage when a falling edge is detected and a second voltage when a rising edge is detected and delays, for a period of time, transitioning from the first voltage to the second voltage when a falling edge is detected. By delaying the output of edge detector 467, protection circuit 445 may avoid prematurely deactivating the third transistor 470 and causing an overvoltage condition at first transistor 430 or second transistor 435. The edge detector 467 may be configured to reduce rapidly activating and deactivating the pull down circuit. The pull down circuit may couple a conductive line with VSS, which may rapidly bring down the voltage of that conductive line. In some cases, the voltage on the conductive line may bounce above and below a trigger point of the comparator and thereby cause the output signal to deactivate and activate the transistor 470 rapidly. To prevent such operations from occurring, the edge detector 467 may delay the outputs until a rising edge or falling edge and evening out some of the bouncing that may occur.

Figure 5:
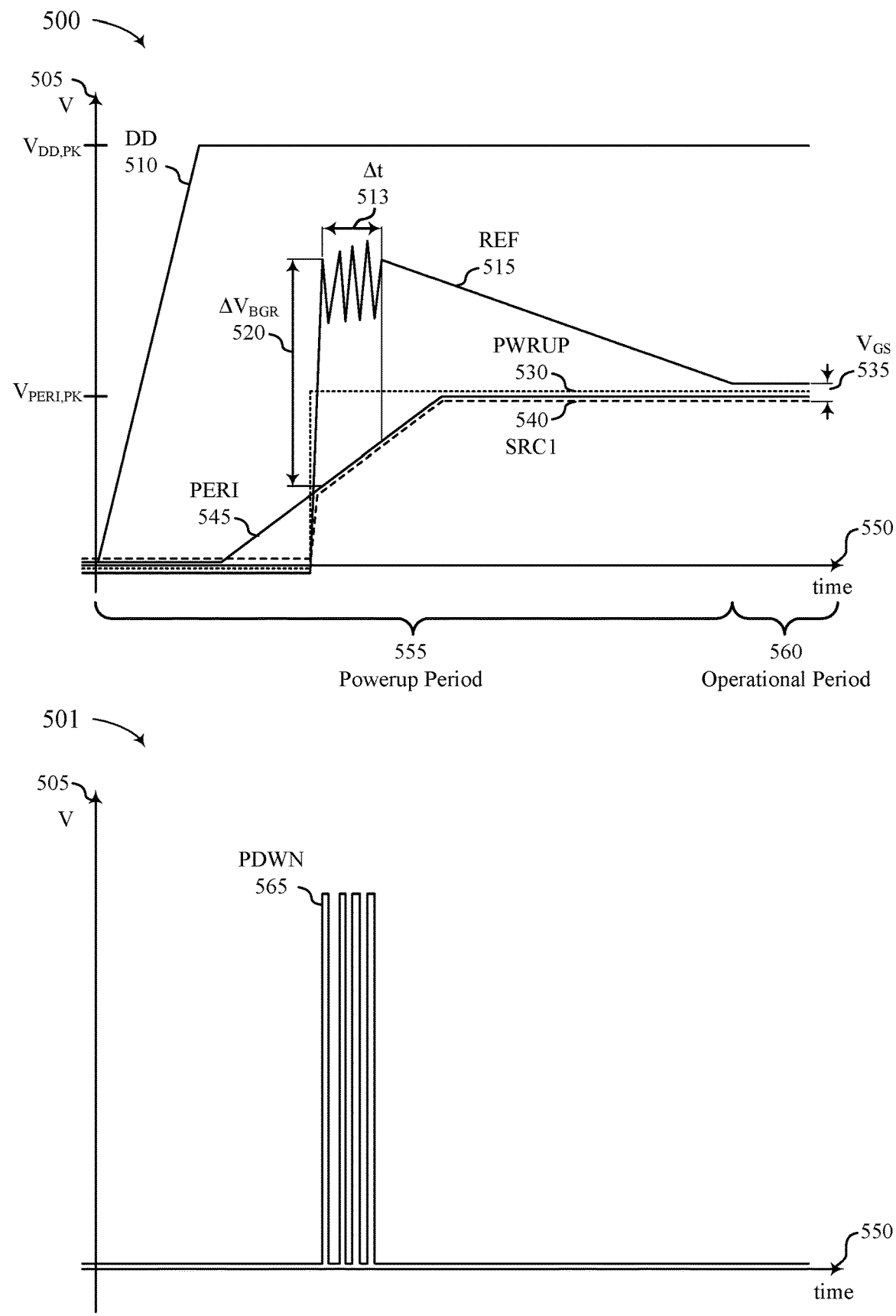
FIG. 5 shows an example of a signal plot that supports overvoltage protection for circuits of memory devices in accordance with examples as disclosed herein.

FIG. 5 shows an example of a signal plot that supports overvoltage protection for circuits of memory devices in accordance with examples as disclosed herein. Signal plot 500 may depict voltages of signals within a memory system (e.g., within system 300 of FIG. 3 or system 400 of FIG. 4) at different instances in time. Signal plot 500 may depict multiple signals having voltages that are centered around a particular voltage level for ease of representation and reference—in such cases, the multiple voltages may each have identical or nearly identical voltage levels. Signal plot 500 may include voltage axis 505 and time axis 550. Time axis 550 may include a powerup period 555 and an operational period 560.

Signal plot 500 may be used to depict supply signal 510, reference signal 515, powerup signal 530, source signal 540, and peripheral signal 545. Supply signal 510 may be present at a $V_{DD}$ supply rail (e.g., first supply rail 315 of FIG. 3 or a $V_{DD}$ supply rail depicted in FIG. 4). Reference signal 515 may be present at an output of a reference signal generator (e.g., an output of reference signal generator 305 of FIG. 3 or output 440 of reference signal generator 405 of FIG. 4). Source signal 540 may be present at a source of a transistor included in a reference signal generator (e.g., at a source of first transistor 330 of FIG. 3 or a source of first transistor 430 of FIG. 4). In some examples, a signal matching source signal 540 may be present at a source of a transistor included in a voltage regulator (e.g., at a source of second transistor 335 of FIG. 3 or a source of second transistor 435 of FIG. 4). Peripheral signal 545 may be present at a $V_{PERI}$ supply rail (e.g., second supply rail 320 of FIG. 3 or a $V_{PERI}$ supply rail depicted in FIG. 4). Powerup signal 530 may represent a voltage of a control signal generated within the memory device to trigger the operation of components within a memory system, including a reference signal generator and voltage regulator for peripheral components.

Signal plot 501 may be used to depict pull-down signal 565 on a same time scale as signal plot 500. Pull-down signal 565 may be present at an input of a pull-down device (e.g., pull-down circuit 350 of FIG. 3 or third transistor 470 of FIG. 4).

Prior to powerup period 555, a memory system may be turned off and each of the depicted signals may be at or around a ground voltage. At a beginning of powerup period 555, a first voltage source that outputs a first voltage ($V_{DD,PK}$) may be connected to one or more $V_{DD}$ supply rails. Accordingly, supply signal 510 may begin rising toward $V_{DD,PK}$. Once the supply signal 510 reaches $V_{DD}$, a second voltage source may be connected to one or more $V_{PERI}$ supply rails. In some examples, the second voltage source is powered by the first voltage source. The second voltage source may output a second voltage ($V_{PERI,PK}$). Accordingly, peripheral signal 545 may begin rising toward $V_{PERI,PK}$. In some examples, peripheral signal 545 reaches $V_{PERI,PK}$ within 10 microseconds. In other examples, peripheral signal 545 reaches $V_{PERI,PK}$ within 100 microseconds.

At a certain voltage level (e.g., ~ 0.8V), peripheral signal 545 may trigger powerup signal (including powerup signal 530) to transition to a voltage level for activating other components within the memory system. Powerup signal 530 may quickly rise to the voltage level for activating other components within the memory system, including a reference signal generator and a voltage regulator. In some examples, the voltage level is similar to a level of $V_{PERI,PK}$.

After powerup signal 530 activates the reference signal generator, a voltage of reference signal 515 may quickly rise toward $V_{DD,PK}$—e.g., based on an operational amplifier within reference signal generator acting as a comparator. Additionally, source signal 540 may rise to match (or closely match) a voltage of peripheral signal 545—e.g., based on ninth transistor (T9) of FIG. 4 being activated and first transistor 430 entering a linear region. Thus, a voltage difference between reference signal 515 and source signal 540 may increase as reference signal increases. Also, the voltage difference between reference signal 515 and source signal 540 may match gate-to-source voltage 535, where gate-to-source voltage 535 may represent a voltage difference between a voltage of a gate and source of the transistor.

Once the voltage difference between reference signal 515 and peripheral signal 545 (($V_{REF}-V_{PERI}$), and similarly, ($V_{REF}-V_{SRC1}$)) reaches voltage difference 520, a protection circuit may be triggered and a voltage of pull-down signal 565 may increase, activating a pull-down device (e.g., third transistor 470 of FIG. 4). In some examples, voltage difference 520 may be equivalent to a voltage of a band gap reference signal applied to an input of a comparator within the protection circuit—e.g., voltage difference 520 may match a voltage of reference input 475 of FIG. 4.

Activating the pull-down device, may cause a voltage of reference signal 515 to decrease toward a ground reference. As the voltage of reference signal 515 decreases, a voltage of pull-down signal 565 may remain high (despite the voltage difference between reference signal 515 and peripheral signal 545 decreasing below the band gap reference voltage) for an increased duration—e.g., based on a delay introduced by a delay component (e.g., delay circuit 465 of FIG. 4). After the duration expires, a voltage of pull-down signal 565 may return to a low voltage, disabling the pull-down device. Accordingly, a voltage of reference signal 515 may again increase toward $V_{DD,PK}$. This process may continue for duration 513 until a voltage of peripheral signal 545 reaches a safe operation level that enables the operational amplifier within the reference signal generator to act as an amplifier (e.g., as a voltage follower), rather than a comparator.

After peripheral signal 545 reaches the level that enables the operational amplifier to act as an amplifier, a voltage of the output of the amplifier (and thus reference signal 515) may be driven to a voltage that is based on a voltage of an input signal provided to a positive terminal of the amplifier and a threshold voltage of a transistor coupled with the amplifier. An operational period 560 for the reference signal generator may begin when gate-to-source voltage 535 reaches a value near a threshold voltage of the transistor in the reference signal generator.

By protecting the transistors in the reference signal generator and/or voltage regulators, rather than delaying an activation of the reference signal generator until a voltage of peripheral signal 545 reaches the safe operation level, a memory system may perform initialization procedures, and thus being performing operational procedures, more quickly. In some examples, a memory system includes additional powerup control signals that may occur before or after powerup signal 530. In such examples, simply using later powerup signals (e.g., the latest powerup signal) to activate the reference signal generator may fail to prevent an excessive voltage from being applied across the transistor(s)—e.g., when peripheral signal 545 slowly ramps to $V_{PERI,PK}$; for example, in 100 microseconds. Thus, the protection circuit may be used to protect the voltage of the transistor(s) regardless of a timing of the powerup signals and/or a rate at which a voltage of peripheral signal 545 increases. In some examples, powerup signal 530 represents the powerup signal that occurs at a latest time within a memory system.

Although discussed in the context of a powerup operation, the protection circuit may also be used to protect the transistors in the reference signal generator and voltage regulator during an operational period. That is, transients in a voltage output by the reference signal generator, reference signal 515, or output by a peripheral voltage supply, peripheral signal 545, may cause an excessive voltage to be applied across a transistor. In such cases, the protection circuit may similarly activate a pull-down device to pull down the voltage of reference signal 515, protecting the transistors in the reference signal generator and/or voltage regulators during operation.

Figure 6:
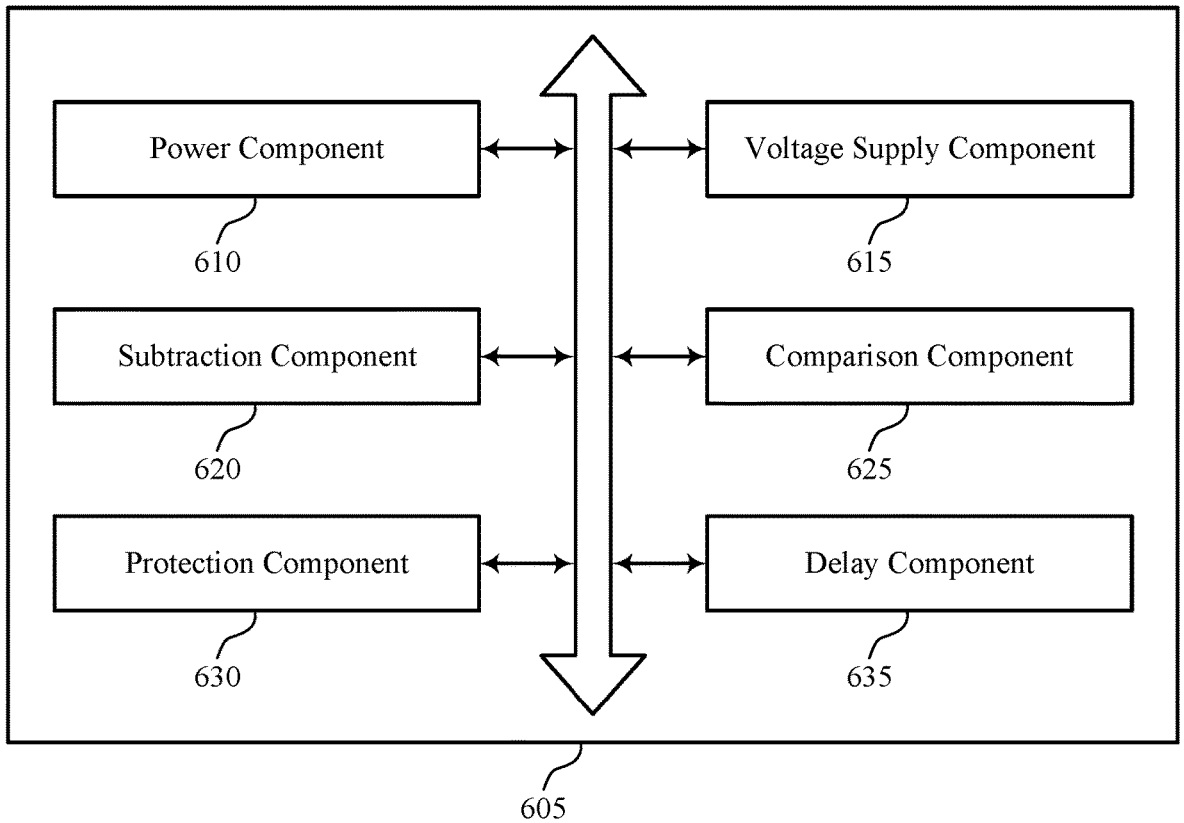
FIG. 6 shows a block diagram of a memory array that supports overvoltage protection for circuits of memory devices in accordance with examples as disclosed herein.

FIG. 6 shows a block diagram 600 of a memory controller 605 that supports overvoltage protection for circuits of memory devices in accordance with examples as disclosed herein. The memory controller 605 may be an example of a device memory controller or a local memory controller as described with reference to FIGS. 1 and 2. The memory controller 605 may include a power component 610, a voltage supply component 615, a subtraction component 620, a comparison component 625, a protection component 630, and a delay component 635. Each of these modules may communicate, directly or indirectly, with one another (e.g., via one or more buses).

The power component 610 may transition a voltage supply that is coupled with a voltage regulator from a first voltage to a second voltage.

The voltage supply component 615 may activate a reference circuit that includes a transistor and provides a reference voltage for controlling the voltage regulator based on transitioning the voltage supply, where a third voltage of a gate of the transistor matches the reference voltage and a fourth voltage of a second node of the transistor is based on transitioning the voltage supply.

The subtraction component 620 may determine a difference between the third voltage of the gate of the transistor and a voltage of the voltage supply.

The protection component 630 may activate a pull-down circuit that is coupled with the gate of the transistor based on the difference exceeding an upper voltage limit associated with the transistor. In some cases, the pull-down circuit couples the gate of the transistor with a ground reference based on being activated. In some examples, the protection component 630 may transition a control signal for the pull-down circuit to an activation voltage based on the difference between the voltage of the gate of the transistor and the voltage of the voltage supply being greater than the upper voltage limit for the transistor, where the pull-down circuit is activated based on the control signal having the activation voltage. In some examples, the protection component 630 may deactivate the pull-down circuit by transitioning the control signal to a deactivation voltage based on the difference between the voltage of the gate of the transistor and the voltage of the voltage supply being lower than or equal to the upper voltage limit associated with the transistor.

The comparison component 625 may compare the difference between the third voltage of the gate of the transistor and the voltage of the voltage supply with a second reference voltage that is based on the upper voltage limit for the transistor, where the pull-down circuit is activated based on the difference exceeding the second reference voltage.

The delay component 635 may maintain, for a duration, the control signal for the pull-down circuit at the activation voltage based on the difference between the voltage of the gate of the transistor and the voltage of the voltage supply falling below or equaling the upper voltage limit associated with the transistor. In some examples, the delay component 635 may transition the control signal to a deactivation voltage based on the difference between the voltage of the gate of the transistor and the voltage of the voltage supply remaining at or below the upper voltage limit associated with the duration.

Figure 7:
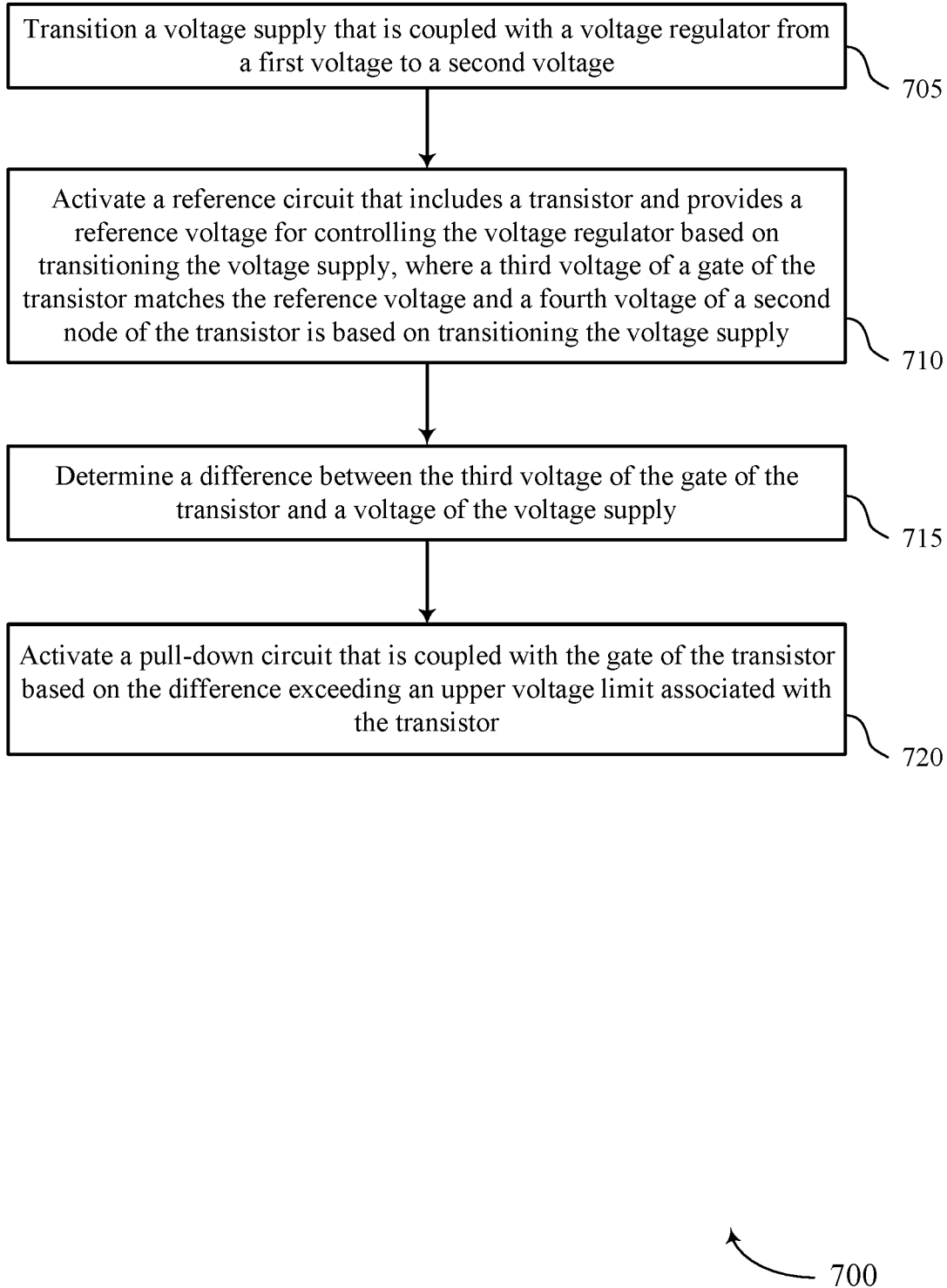
FIG. 7 shows a flowchart illustrating a method or methods that support overvoltage protection for circuits of memory devices in accordance with examples as disclosed herein.

FIG. 7 shows a flowchart illustrating a method or methods that supports overvoltage protection for circuits of memory devices in accordance with examples as disclosed herein. The operations of method 700 may be implemented by a memory array or its components as described herein. For example, the operations of method 700 may be performed by a memory array as described with reference to FIG. 6. In some examples, a memory array may execute a set of instructions to control the functional elements of the memory array to perform the described functions. Additionally, or alternatively, a memory array may perform aspects of the described functions using special-purpose hardware.

At 705, the memory array may transition a voltage supply that is coupled with a voltage regulator from a first voltage to a second voltage. The operations of 705 may be performed according to the methods described herein. In some examples, aspects of the operations of 705 may be performed by a power component as described with reference to FIG. 6.

At 710, the memory array may activate a reference circuit that includes a transistor and provides a reference voltage for controlling the voltage regulator based on transitioning the voltage supply, where a third voltage of a gate of the transistor matches the reference voltage and a fourth voltage of a second node of the transistor is based on transitioning the voltage supply. The operations of 710 may be performed according to the methods described herein. In some examples, aspects of the operations of 710 may be performed by a voltage supply component as described with reference to FIG. 6.

At 715, the memory array may determine a difference between the third voltage of the gate of the transistor and a voltage of the voltage supply. The operations of 715 may be performed according to the methods described herein. In some examples, aspects of the operations of 715 may be performed by a subtraction component as described with reference to FIG. 6 or a protection circuit 345 as described with reference to FIG. 3, or any combination thereof.

At 720, the memory array may activate a pull-down circuit that is coupled with the gate of the transistor based on the difference exceeding an upper voltage limit associated with the transistor. The operations of 720 may be performed according to the methods described herein. In some examples, aspects of the operations of 720 may be performed by a protection component as described with reference to FIG. 6 or a protection circuit 345 as described with reference to FIG. 3, or any combination thereof.

Some examples of the method 700 described herein may further include operations, features, means, or instructions for comparing the difference between the third voltage of the gate of the transistor and the voltage of the voltage supply with a second reference voltage that is based on the upper voltage limit for the transistor, wherein the pull-down circuit is activated based on the difference exceeding the second reference voltage.

Some examples of the method 700 described herein may further include operations, features, means, or instructions for activating the pull-down circuit by transitioning a control signal for the pull-down circuit to an activation voltage based on the difference between the voltage of the gate of the transistor and the voltage of the voltage supply being greater than the upper voltage limit for the transistor, wherein the pull-down circuit is activated based on the control signal having the activation voltage.

Some examples of the method 700 described herein may further include operations, features, means, or instructions for deactivating the pull-down circuit by transitioning the control signal to a deactivation voltage based on the difference between the voltage of the gate of the transistor and the voltage of the voltage supply being lower than or equal to the upper voltage limit associated with the transistor.

Some examples of the method 700 described herein may further include operations, features, means, or instructions for maintaining, for a duration, the control signal for the pull-down circuit at the activation voltage based on the difference between the voltage of the gate of the transistor and the voltage of the voltage supply falling below or equaling the upper voltage limit associated with the transistor.

Some examples of the method 700 described herein may further include operations, features, means, or instructions for transitioning the control signal to a deactivation voltage based on the difference between the voltage of the gate of the transistor and the voltage of the voltage supply remaining at or below the upper voltage limit associated with the duration.

In some examples of the method 700, the pull-down circuit couples the gate of the transistor with a ground reference based on being activated.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a voltage regulator configured to regulate a voltage source, a reference circuit configured to generate a reference signal for the voltage regulator based on a first voltage of the voltage source, the reference circuit including a transistor having a gate, a first node that is coupled with the voltage source, and a second node, and a protection circuit configured to maintain a difference between a second voltage of the gate of the transistor and a third voltage of the second node of the transistor below an upper voltage limit.

In some examples, the protection circuit may include operations, features, means, or instructions for a comparator configured to generate an indication based on the upper voltage limit and the difference between the second voltage of the gate of the transistor and the third voltage of the second node of the transistor, and a pull-down circuit configured to pull down the second voltage of the gate of the transistor based on the indication.

In some examples, the protection circuit may include operations, features, means, or instructions for a delay component configured to filter out transient outputs of the comparator.

In some examples, the protection circuit may include operations, features, means, or instructions for a first inversion component coupled with the comparator and the delay component and configured to invert an output of the comparator, and a second inversion component coupled with the delay component and the pull-down circuit and configured to invert an output of the delay component.

In some examples, to generate the indication, the comparator may be configured to generate a fourth voltage when a second difference between the second voltage of the gate of the transistor and the third voltage of the voltage source may be below the upper voltage limit and a fifth voltage when the second difference may be above the upper voltage limit.

In some examples, the protection circuit may include operations, features, means, or instructions for a delay component configured to ignore a voltage pulse associated with a transition from the fifth voltage to the fourth voltage and back to the fifth voltage when a duration of the voltage pulse may be less than a threshold duration.

In some examples, the protection circuit may include operations, features, means, or instructions for a delay component configured to output, to the pull-down circuit, a signal associated with the indication of the comparator at a first edge of a clock signal.

In some examples, the comparator may include operations, features, means, or instructions for a second transistor, where a gate of the second transistor may be coupled with a drain of the second transistor and a source of the second transistor may be coupled with a second voltage source, a third transistor coupled with the second voltage source, where a gate of the third transistor may be coupled with the gate of the second transistor and a source of the third transistor may be coupled with the second voltage source, a fourth transistor, where a gate of the fourth transistor may be coupled with an output of the reference circuit, a source of the fourth transistor may be coupled with the voltage source, and a drain of the fourth transistor may be coupled with the drain of the second transistor, and a fifth transistor, where a gate of the fifth transistor may be coupled with a reference voltage that may be associated with the upper voltage limit, a source of the fifth transistor may be coupled with a ground reference, and a drain of the fifth transistor may be coupled with a drain of the third transistor, the output of the comparator being coupled with the drain of the fifth transistor.

In some examples, the reference circuit may include operations, features, means, or instructions for an amplifier coupled with a second voltage source and configured to receive an input signal associated with the reference signal generated by the reference circuit, a biasing component configured to configure the transistor in a saturated state, the biasing component including at least one resistor, and a second transistor coupled between the voltage source and the first node of the transistor.

In some examples, an input of the amplifier may be coupled with the second node of the transistor, and an output of the amplifier may be coupled with the gate of the transistor.

An apparatus is described. The apparatus may include a voltage supply, a voltage regulator coupled with the voltage supply, a reference circuit that includes a transistor, the reference circuit being coupled with the voltage supply and configured to provide a reference voltage for controlling the voltage regulator, a pull-down circuit coupled with the reference circuit a gate of the transistor, a control component coupled with the reference circuit and the pull-down circuit, where the control component is configured to cause the apparatus to, activate the reference circuit based on transitioning the voltage supply, where a third voltage of the gate of the transistor circuit matches the reference voltage output by the reference circuit and a fourth voltage of a second node of the transistor is based on the voltage of the voltage supply, determine a difference between the third voltage of the gate of the transistor and a voltage of the voltage supply, and activate the pull-down circuit based on the difference exceeding an upper voltage limit associated with the transistor.

Some examples may further include comparing the difference between the third voltage of the gate of the transistor and the voltage of the voltage supply with a second reference voltage that may be based on the upper voltage limit for the transistor, where the pull-down circuit may be activated based on the difference exceeding the second reference voltage.

Some examples may further include transitioning a control signal for the pull-down circuit to an activation voltage based on the difference between the voltage of the gate of the transistor and the voltage of the voltage supply being greater than the upper voltage limit for the transistor, where the pull-down circuit may be activated based on the control signal having the activation voltage.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may show signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a voltage regulator configured to regulate a voltage source;
   a reference circuit configured to generate a reference signal for the voltage regulator based at least in part on a first voltage of the voltage source, the reference circuit comprising a transistor having a gate, a first node that is coupled with the voltage source, and a second node, wherein the reference circuit comprises:
     an amplifier coupled with a second voltage source and configured to receive an input signal associated with the reference signal generated by the reference circuit,
     a biasing component configured to configure the transistor in a saturated state, the biasing component comprising at least one resistor, and
     a second transistor coupled between the voltage source and the first node of the transistor; and
   a protection circuit configured to maintain a difference between a second voltage of the gate of the transistor and a third voltage of the second node of the transistor below an upper voltage limit.

2. The apparatus of claim 1, wherein the protection circuit comprises:
   a comparator configured to generate an indication based at least in part on the upper voltage limit and the difference between the second voltage of the gate of the transistor and the third voltage of the second node of the transistor; and
   a pull-down circuit configured to pull down the second voltage of the gate of the transistor based at least in part on the indication.

3. An apparatus, comprising:
   a voltage regulator configured to regulate a voltage source;
   a reference circuit configured to generate a reference signal for the voltage regulator based at least in part on a first voltage of the voltage source, the reference circuit comprising a transistor having a gate, a first node that is coupled with the voltage source, and a second node;
   a protection circuit configured to maintain a difference between a second voltage of the gate of the transistor and a third voltage of the second node of the transistor below an upper voltage limit, wherein the protection circuit comprises:
     a comparator configured to generate an indication based at least in part on the upper voltage limit and the difference between the second voltage of the gate of the transistor and the third voltage of the second node of the transistor, and
     a pull-down circuit configured to pull down the second voltage of the gate of the transistor based at least in part on the indication; and
     a delay component configured to filter out transient outputs of the comparator.

4. The apparatus of claim 3, wherein the protection circuit comprises:
   a first inversion component coupled with the comparator and the delay component and configured to invert an output of the comparator; and
   a second inversion component coupled with the delay component and the pull-down circuit and configured to invert an output of the delay component.

5. The apparatus of claim 3, wherein, to generate the indication, the comparator is configured to generate a fourth voltage when a second difference between the second voltage of the gate of the transistor and the third voltage of the voltage source is below the upper voltage limit and a fifth voltage when the second difference is above the upper voltage limit.

6. The apparatus of claim 5, wherein, to filter out transient outputs of the comparator, the delay component is configured to:
   ignore a voltage pulse associated with a transition from the fifth voltage to the fourth voltage and back to the fifth voltage when a duration of the voltage pulse is less than a threshold duration.

7. The apparatus of claim 3, wherein, to filter out transient outputs of the comparator, the delay component is configured to:
   output, to the pull-down circuit, a signal associated with the indication of the comparator at a first edge of a clock signal.

8. An apparatus, comprising:
   a voltage regulator configured to regulate a voltage source;
   a reference circuit configured to generate a reference signal for the voltage regulator based at least in part on a first voltage of the voltage source, the reference circuit comprising a transistor having a gate, a first node that is coupled with the voltage source, and a second node; and
   a protection circuit configured to maintain a difference between a second voltage of the gate of the transistor and a third voltage of the second node of the transistor below an upper voltage limit, wherein the protection circuit comprises:
- a comparator configured to generate an indication based at least in part on the upper voltage limit and the difference between the second voltage of the gate of the transistor and the third voltage of the second node of the transistor, wherein the comparator comprises:
  - a second transistor, wherein a gate of the second transistor is coupled with a drain of the second transistor and a source of the second transistor is coupled with a second voltage source,
  - a third transistor coupled with the second voltage source, wherein a gate of the third transistor is coupled with the gate of the second transistor and a source of the third transistor is coupled with the second voltage source,
  - a fourth transistor, wherein a gate of the fourth transistor is coupled with an output of the reference circuit, a source of the fourth transistor is coupled with the voltage source, and a drain of the fourth transistor is coupled with the drain of the second transistor, and
  - a fifth transistor, wherein a gate of the fifth transistor is coupled with a reference voltage that is associated with the upper voltage limit, a source of the fifth transistor is coupled with a ground reference, and a drain of the fifth transistor is coupled with a drain of the third transistor, an output of the comparator being coupled with the drain of the fifth transistor; and
- a pull-down circuit configured to pull down the second voltage of the late of the transistor based at least in part on the indication.

9. The apparatus of claim 1, wherein an input of the amplifier is coupled with the second node of the transistor, and an output of the amplifier is coupled with the gate of the transistor.

10. A method, comprising:
- transitioning a voltage supply that is coupled with a voltage regulator from a first voltage to a second voltage;
- activating a reference circuit that comprises a transistor and provides a reference voltage for controlling the voltage regulator based at least in part on transitioning the voltage supply, wherein a third voltage of a gate of the transistor matches the reference voltage and a fourth voltage of a second node of the transistor is based at least in part on transitioning the voltage supply;
- determining a difference between the third voltage of the gate of the transistor and a voltage of the voltage supply;
- comparing the difference with a second reference voltage that is based at least in part on an upper voltage limit for the transistor;
- activating, based at least in part on the comparing, a pull-down circuit that is coupled with the gate of the transistor based at least in part on the difference exceeding the second reference voltage, wherein activating the pull-down circuit comprises transitioning a control signal for the pull-down circuit to an activation voltage; and
- maintaining, for a duration, the control signal for the pull-down circuit at the activation voltage based at least in part on the difference between the voltage of the gate of the transistor and the voltage of the voltage supply falling below or equaling the upper voltage limit associated with the transistor.

11. The method of claim 10, further comprising:
- deactivating the pull-down circuit by transitioning the control signal to a deactivation voltage based at least in part on the difference between the voltage of the gate of the transistor and the voltage of the voltage supply being lower than or equal to the upper voltage limit associated with the transistor.

12. The method of claim 10, further comprising:
- transitioning the control signal to a deactivation voltage based at least in part on the difference between the voltage of the gate of the transistor and the voltage of the voltage supply remaining at or below the upper voltage limit associated with the duration.

13. The method of claim 10, wherein the pull-down circuit couples the gate of the transistor with a ground reference based at least in part on being activated.

14. An apparatus, comprising:
- a voltage supply;
- a voltage regulator coupled with the voltage supply;
- a reference circuit that comprises a transistor, the reference circuit being coupled with the voltage supply and configured to provide a reference voltage for controlling the voltage regulator;
- a pull-down circuit coupled with the reference circuit and a gate of the transistor; and
- a control component coupled with the reference circuit and the pull-down circuit, wherein the control component is configured to cause the apparatus to:
  - transition the voltage supply from a first voltage to a second voltage;
  - activate the reference circuit based at least in part on transitioning the voltage supply, wherein a third voltage of the gate of the transistor is configured to match the reference voltage output by the reference circuit and a fourth voltage of a second node of the transistor is based at least in part on a voltage of the voltage supply;
  - determine a difference between the third voltage of the gate of the transistor and the voltage of the voltage supply;
  - compare the difference with a second reference voltage that is based at least in part on an upper voltage limit for the transistor;
  - activate, based at least in part on the comparing, the pull-down circuit based at least in part on the difference exceeding the second reference voltage, wherein, to activate the pull-down circuit, the control component is further configured to cause the apparatus to transition a control signal for the pull-down circuit to an activation voltage; and
  - maintain, for a duration, the control signal for the pull-down circuit at the activation voltage based at least in part on the difference between the voltage of the gate of the transistor and the voltage of the voltage supply falling below or equaling the upper voltage limit associated with the transistor.

15. The apparatus of claim 14, wherein the control component is further configured to cause the apparatus to:
- deactivate the pull-down circuit by transitioning the control signal to a deactivation voltage based at least in part on the difference between the voltage of the gate of the transistor and the voltage of the voltage supply being lower than or equal to the upper voltage limit associated with the transistor.

16. The apparatus of claim 14, wherein the control component is further configured to cause the apparatus to:
transition the control signal to a deactivation voltage based at least in part on the difference between the voltage of the gate of the transistor and the voltage of the voltage supply remaining at or below the upper voltage limit associated with the duration.

17. The apparatus of claim 14, wherein the pull-down circuit is configured to couple the gate of the transistor with a ground reference based at least in part on being activated.

* * * * *